US009177974B2

United States Patent
Chikama et al.

(10) Patent No.: US 9,177,974 B2

(45) Date of Patent: Nov. 3, 2015

(54) ACTIVE MATRIX SUBSTRATE AND LIQUID CRYSTAL DISPLAY PANEL INCLUDING THE SAME, AND METHOD FOR MANUFACTURING ACTIVE MATRIX SUBSTRATE WITH GATE INSULATING FILM NOT PROVIDED WHERE AUXILIARY CAPACITOR IS PROVIDED

(75) Inventors: Yoshimasa Chikama, Osaka (JP); Hirohiko Nishiki, Osaka (JP); Yoshifumi Ohta, Osaka (JP); Yuuiji Mizuno, Osaka (JP); Hinae Mizuno, legal representative, Yamato (JP); Takeshi Hara, Osaka (JP); Tetsuya Aita, Osaka (JP); Masahiko Suzuki, Osaka (JP); Michiko Takei, Osaka (JP); Okifumi Nakagawa, Osaka (JP); Yoshiyuki Harumoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 528 days.

(21) Appl. No.: 13/501,534

(22) PCT Filed: Jul. 26, 2010 (Under 37 CFR 1.47)

(86) PCT No.: PCT/JP2010/004744

§ 371 (c)(1), (2), (4) Date: Apr. 12, 2012

(87) PCT Pub. No.: WO2011/055474

PCT Pub. Date: May 12, 2011

(65) Prior Publication Data

US 2012/0218485 A1 Aug. 30, 2012

(30) Foreign Application Priority Data

Nov. 9, 2009 (JP) ................................ 2009-255931

(51) Int. Cl.
*G02F 1/1343* (2006.01)
*G02F 1/1333* (2006.01)
(Continued)

(52) U.S. Cl.
CPC ...... *H01L 27/1255* (2013.01); *G02F 1/136213* (2013.01); *G02F 2201/40* (2013.01); *H01L 27/124* (2013.01); *H01L 27/1225* (2013.01); *H01L 27/1248* (2013.01)

(58) Field of Classification Search
CPC .................... G02F 1/136213; G02F 1/136227; G02F 1/133707; G02F 2201/40; G02F 2001/13606; G02F 2001/136272
USPC ......... 349/39–43; 257/71, E33.053, E29.273; 438/23
See application file for complete search history.

(56) References Cited

U.S. PATENT DOCUMENTS 7,297,977 B2 11/2007 Hoffman et al.
7,382,421 B2 6/2008 Hoffman et al.
(Continued)

FOREIGN PATENT DOCUMENTS

JP 7-56193 A 3/1995
JP 11-15022 A 1/1999
(Continued)

OTHER PUBLICATIONS

Official Communication issued in International Patent Application No. PCT/JP2010/004744, mailed on Sep. 7, 2010.

*Primary Examiner* — Huyen Ngo
(74) *Attorney, Agent, or Firm* — Keating & Bennett, LLP

(57) ABSTRACT

An active matrix substrate includes a plurality of pixels arranged in a matrix, a plurality of capacitor lines (11*b*) extending in one of directions in which the pixels are aligned and in parallel to each other, a plurality of TFTs (5), one for each of the pixels, a protective film (16*a*) covering the TFTs (5), a plurality of pixel electrodes (18*a*) arranged in a matrix on the protective film (16*a*) and connected to the respective corresponding TFTs (5), and a plurality of auxiliary capacitors (6), one for each of the pixels. Each of the auxiliary capacitors (6) includes the corresponding capacitor line (11*b*), the corresponding pixel electrode (18*a*), and the protective film (16*a*) between the corresponding capacitor line (11*b*) and the corresponding pixel electrode (18*a*).

12 Claims, 10 Drawing Sheets

(51) Int. Cl.

| | |
|---|---|
| ***G02F 1/136*** | (2006.01) |
| ***H01L 27/12*** | (2006.01) |
| ***G02F 1/1362*** | (2006.01) |

(56) References Cited

U.S. PATENT DOCUMENTS

| | | | | |
|---|---|---|---|---|
| 7,791,072 | B2 | 9/2010 | Kumomi et al. | |
| 7,868,326 | B2 | 1/2011 | Sano et al. | |
| 8,531,620 | B2 * | 9/2013 | Tsubata | 349/48 |
| 2005/0039670 | A1 | 2/2005 | Hosono et al. | |
| 2007/0040977 | A1 | 2/2007 | Kurosawa et al. | |
| 2007/0072439 | A1 | 3/2007 | Akimoto et al. | |
| 2007/0090421 | A1 | 4/2007 | Jung | |
| 2007/0158729 | A1 | 7/2007 | Yang et al. | |
| 2009/0001374 | A1 | 1/2009 | Inoue et al. | |
| 2010/0065837 | A1 | 3/2010 | Omura et al. | |
| 2010/0085499 | A1 * | 4/2010 | Hirato | 349/39 |
| 2010/0165225 | A1 * | 7/2010 | Nakagawa | 349/39 |

FOREIGN PATENT DOCUMENTS

| | | | |
|---|---|---|---|
| JP | 2002-148658 | A | 5/2002 |
| JP | 2002-182245 | A | 6/2002 |
| JP | 2006-330201 | A | 12/2006 |
| JP | 2007-114734 | A | 5/2007 |
| JP | 2007-123861 | A | 5/2007 |
| JP | 2007-183629 | A | 7/2007 |
| JP | 2007-235102 | A | 9/2007 |
| JP | 4164562 | B2 | 10/2008 |
| JP | 2009-135380 | A | 6/2009 |

* cited by examiner (a)
11a
11b
11a,11c
10
(b)
13a
12
10
11a
11b
11a,11c
(c)
Ca
13a
14a
Cb
Cc
12a
Cd
10
11a
11b
11a,11c
(d)
15b
13a
14a
15c
15d
12a
15e
10
5
11a
11b
11a,11c
(e)
15b
13a
14a
Ce
15c
16
15d
16a
12a
Cf
15e
10
5
11a
11b
11a,11c
(f)
20a
15b
13a
14a
15c
18a
15d
16a
12a
18b
15e
10
5
11a
6
11b
7
11c (a)
11e
11e
10
(b)
13a
12
10
11e
11e
(c)
Ca 13a 14b Cb Ch
12b
10
11e
11e
(d)
15b 13a 14b 15c 15f
12b
10
5 11e
11e
(e)
15b 13a 14b Ce 16 15c 15f 16d
12b
10
5 11e
11e
(f)
20c
15b 13a 14b 15c 18c 15f 16d
12b
10
5 11e
6 11e

ACTIVE MATRIX SUBSTRATE AND LIQUID CRYSTAL DISPLAY PANEL INCLUDING THE SAME, AND METHOD FOR MANUFACTURING ACTIVE MATRIX SUBSTRATE WITH GATE INSULATING FILM NOT PROVIDED WHERE AUXILIARY CAPACITOR IS PROVIDED

TECHNICAL FIELD

The present invention relates to active matrix substrates and liquid crystal display panels including the same, and methods for manufacturing an active matrix substrate. More particularly, the present invention relates to active matrix substrates having an auxiliary capacitor and liquid crystal display panels including the same, and methods for manufacturing the active matrix substrate.

BACKGROUND ART

A liquid crystal display panel includes, for example, an active matrix substrate, a counter substrate facing the active matrix substrate, and a liquid crystal layer provided between the substrates. On the active matrix substrate, a thin film transistor (hereinafter referred to as a "TFT") is provided for each pixel, which is the smallest unit of an image, and an auxiliary capacitor is provided in parallel to the liquid crystal capacitor of each pixel in order to stably hold electric charge stored in the liquid crystal layer (i.e., the liquid crystal capacitor) of the pixel.

For example, Patent Document 1 describes a TFT panel in which a TFT, a pixel electrode, and an auxiliary capacitor electrode are provided in the vicinity of each of intersections between scan signal lines and data signal lines arranged in a matrix. In the TFT panel, a gate insulating film is provided between the scan signal line and the data signal line and between the auxiliary capacitor electrode and the data signal line, and a dielectric strength improvement insulating film which is provided between the data signal line and the auxiliary capacitor electrode does not protrude outside the auxiliary capacitor electrode, whereby a step which would otherwise be caused by an end portion of the auxiliary capacitor electrode is not formed on the dielectric strength improvement insulating film, and therefore, a break is unlikely to occur in the data signal line on the dielectric strength improvement insulating film.

CITATION LIST

Patent Document

Patent Document 1: Japanese Patent Publication No. 2002-148658

SUMMARY OF THE INVENTION

Technical Problem

FIG. 13 is a cross-sectional view of a conventional active matrix substrate 120.

As shown in FIG. 13, the active matrix substrate 120 includes a TFT 105 and an auxiliary capacitor 106 for each pixel.

As shown in FIG. 13, the TFT 105 includes a gate electrode 111*a* provided on an insulating substrate 110, a gate insulating film 112 covering the gate electrode 111*a*, an amorphous silicon layer 113*a* provided on the gate insulating film 112, a channel protective film 114 and an $N^+$ amorphous silicon layer 113*b* provided on the amorphous silicon layer 113*a*, and a source electrode 115*b* and a drain electrode 115*c* provided on the $N^+$ amorphous silicon layer 113*b*. Here, the drain electrode 115*c* is connected to a pixel electrode 118 via a contact hole which is formed in a protective film 116 covering the TFT 105.

As shown in FIG. 13, the auxiliary capacitor 106 includes a capacitor line 111*b* provided in the same layer in which the gate electrode 111*a* is provided, and formed of the same material of which the gate electrode 111*a* is formed, a gate insulating film 12 and the protective film 116 successively formed to cover the capacitor line 111*b*, and the pixel electrode 118 provided on the protective film 116.

Here, the gate insulating film 112 needs to have a thickness sufficient to reliably insulate a gate line connected to the gate electrode 111*a* from a source line connected to the source electrode 115*b*. However, as the thickness of the gate insulating film 112 increases, the electric capacity of the auxiliary capacitor 106 decreases. Therefore, in order to set the electric capacity of the auxiliary capacitor 106 to be the same as or similar to the electric capacity of the liquid crystal capacitor, the area of the auxiliary capacitor 106 needs to be increased. In this case, the aperture ratio of the pixel decreases. There is a trade-off between the electric capacity of the auxiliary capacitor and the aperture ratio of the pixel.

The present invention has been made in view of the above problem. It is an object of the present invention to increase the electric capacity of the auxiliary capacitor while reducing the decrease in the aperture ratio of the pixel.

Solution to the Problem

In order to achieve the object, in the present invention, the protective film covering the thin film transistor serves as the insulating film of the auxiliary capacitor.

Specifically, an active matrix substrate according to the present invention includes a plurality of pixels arranged in a matrix, a plurality of capacitor lines extending in one of directions in which the pixels are aligned and in parallel to each other, a plurality of thin film transistors, one for each of the pixels, a protective film covering the thin film transistors, a plurality of pixel electrodes arranged in a matrix on the protective film and connected to the respective corresponding thin film transistors, and a plurality of auxiliary capacitors, one for each of the pixels, Each of the auxiliary capacitors includes the corresponding capacitor line, the corresponding pixel electrode, and the protective film between the corresponding capacitor line and the corresponding pixel electrode.

With the above configuration, in the auxiliary capacitor (one for each pixel), the insulating film provided between the capacitor line and the pixel electrode does not include the gate insulating film which needs to be relatively thick (e.g., about 300-500 nm) for the purpose of the coverage of the gate line and the dielectric strength, and includes only the protective film which has been provided by removing the gate insulating film and is relatively thin (e.g., about 50-300 nm). As a result, the electric capacity per unit area of the auxiliary capacitor is relatively large (in inverse proportion to the thickness of the insulating film). Therefore, in each pixel, the auxiliary capacitor can be designed to have a smaller area, whereby the electric capacity of the auxiliary capacitor can be increased while the decrease in the aperture ratio of the pixel is reduced.

Specifically, in the active matrix substrate, assuming that the protective film and the gate insulating film are made of the same material, the protective film has a thickness of 50 nm, and the gate insulating film has a thickness of 300 nm, the area of the auxiliary capacitor including the protective film is 1/6 of the area of the auxiliary capacitor including the gate insulating film, according to expression $C=\epsilon S/d$ (C: electric capacity, $\epsilon$: dielectric constant, S: area, and d: thickness).

A gate line connected to the corresponding thin film transistor may be provided between each of the capacitor lines and may extend along the corresponding capacitor line.

With the above configuration, the gate lines are each separately provided between the corresponding capacitor lines, and therefore, the active matrix substrate specifically has the Cs-on-Common structure.

Each of the capacitor lines may be a gate line.

With the above configuration, the capacitor lines are also each a gate line, and therefore, the active matrix substrate specifically has the Cs-on-Gate structure.

A portion of the protective film which is included in each of the auxiliary capacitors may be thinner than a portion of the protective film which covers each of the thin film transistors.

With the above configuration, a portion of the protective film which is included in each of the auxiliary capacitors is relatively thin, and therefore, the electric capacity per unit area of the auxiliary capacitor is further increased.

Each of the auxiliary capacitors may include a conductive layer which is provided between the corresponding capacitor line and the protective film, and is provided in the same layer in which the source and drain electrodes of the corresponding thin film transistor are provided and is formed of the same material of which the source and drain electrodes of the corresponding thin film transistor are formed.

With the above configuration, between the capacitor line and the protective film of each auxiliary capacitor, the conductive layer is provided in the same layer in which the source and drain electrodes of the corresponding thin film transistor are provided and is formed of the same material of which the source and drain electrodes of the corresponding thin film transistor are formed. Therefore, although the gate material for the gate line and the capacitor line is similar to the source material for the source electrode and the drain electrode, and therefore, the combination of the gate material and the source material has a low etch selectivity ratio, the auxiliary capacitor can be configured without providing an additional manufacturing step.

Each of the thin film transistors may include an oxide semiconductor layer.

With the above configuration, each thin film transistor includes an oxide semiconductor layer, and therefore, for example, an $N^+$ amorphous silicon layer for connecting to the source electrode and the drain electrode is no longer required, and therefore, the thin film transistor can have a simpler structure.

A liquid crystal display panel according to the present invention includes an active matrix substrate and a counter substrate facing each other, and a liquid crystal layer provided between the active matrix substrate and the counter substrate, with a plurality of pixels being arranged in a matrix. The active matrix substrate includes a plurality of capacitor lines extending in one of directions in which the pixels are aligned and in parallel to each other, a plurality of thin film transistors, one for each of the pixels, a protective film covering the thin film transistors, a plurality of pixel electrodes arranged in a matrix on the protective film and connected to the respective corresponding thin film transistors, and a plurality of auxiliary capacitors, one for each of the pixels. Each of the auxiliary capacitors includes the corresponding capacitor line, the corresponding pixel electrode, and the protective film between the corresponding capacitor line and the corresponding pixel electrode.

With the above configuration, in the auxiliary capacitor (one for each pixel), the insulating film provided between the capacitor line and the pixel electrode does not include the gate insulating film which needs to be relatively thick (e.g., about 300-500 nm) for the purpose of the coverage of the gate line and the dielectric strength, and includes only the protective film which has been provided by removing the gate insulating film and is relatively thin (e.g., about 50-300 nm). As a result, the electric capacity per unit area of the auxiliary capacitor is relatively large (in inverse proportion to the thickness of the insulating film). Therefore, in each pixel, the auxiliary capacitor can be designed to have a smaller area, whereby the electric capacity of the auxiliary capacitor can be increased while the decrease in the aperture ratio of the pixel is reduced, in the liquid crystal display panel including the active matrix substrate, the counter substrate, and the liquid crystal layer provided between these substrates.

Specifically, in the liquid crystal display panel including the active matrix substrate, assuming that the protective film and the gate insulating film are made of the same material, the protective film has a thickness of 50 nm, and the gate insulating film has a thickness of 300 nm, the area of the auxiliary capacitor including the protective film is 1/6 of the area of the auxiliary capacitor including the gate insulating film, according to expression $C=\epsilon S/d$ (C: electric capacity, $\epsilon$: dielectric constant, S: area, and d: thickness).

A method for manufacturing an active matrix substrate according to the present invention includes a gate layer forming step of forming, on a substrate, a plurality of capacitor lines extending in parallel to each other and a plurality of gate lines each provided between the corresponding capacitor lines and extending along the corresponding capacitor lines, a semiconductor layer forming step of forming a first insulating film covering the capacitor lines and the gate lines, and thereafter, forming a plurality of semiconductor layers directly above the respective corresponding gate lines, a gate insulating film forming step of removing a portion of the first insulating film to expose each of the capacitor lines, thereby forming a gate insulating film, a source layer forming step of forming a source electrode and a drain electrode on each of the semiconductor layers, a protective film forming step of forming a second insulating film covering the source electrodes and the drain electrodes, and thereafter, removing a portion of the second insulating film to expose of a portion of each of the drain electrodes, thereby forming a protective film, and a pixel electrode forming step of forming a plurality of pixel electrodes arranged in a matrix on the protective film, thereby forming a plurality of auxiliary capacitors each including the corresponding capacitor line, the protective film, and the corresponding pixel electrode.

With the above method, in the gate insulating film forming step performed after the semiconductor layer forming step, the first insulating film is formed to cover the capacitor lines and the gate lines which have been formed in the gate layer forming step, and thereafter, a portion of the first insulating film is removed to expose each capacitor line, thereby forming the gate insulating film. In the protective film forming step performed before the pixel electrode forming step, the second insulating film is formed to cover the source and drain electrodes which have been formed in the source layer forming step and the capacitor lines which have been exposed through the gate insulating film in the gate insulating film forming step, and thereafter, a portion of the second insulating film is removed to expose a portion of each of the drain electrodes, thereby forming the protective film. Therefore, in the auxiliary capacitor (one for each pixel), the insulating film provided between the capacitor line and the pixel electrode does not include the gate insulating film which needs to be relatively thick (e.g., about 300-500 nm) for the purpose of the coverage of the gate line and the dielectric strength, and includes only the protective film which has been provided by removing the gate insulating film and is relatively thin (e.g., about 50-300 nm). As a result, the electric capacity per unit area of the auxiliary capacitor is relatively large (in inverse proportion to the thickness of the insulating film). Therefore, in each pixel, the auxiliary capacitor can be designed to have a smaller area, whereby, in the active matrix substrate having the Cs-on-Common structure, the electric capacity of the auxiliary capacitor can be increased while the decrease in the aperture ratio of the pixel is reduced.

Specifically, in the active matrix substrate having the Cs-on-Common structure, assuming that the protective film and the gate insulating film are made of the same material, the protective film has a thickness of 50 nm, and the gate insulating film has a thickness of 300 nm, the area of the auxiliary capacitor including the protective film is 1/6 of the area of the auxiliary capacitor including the gate insulating film, according to expression $C=\epsilon S/d$ (C: electric capacity, $\epsilon$: dielectric constant, S: area, and d: thickness).

Another method for manufacturing an active matrix substrate according to the present invention includes a gate layer forming step of forming, on a substrate, a plurality of gate lines extending in parallel to each other, a semiconductor layer forming step of forming a first insulating film covering the gate lines, and thereafter, forming a plurality of semiconductor layers directly above the respective corresponding gate lines, a gate insulating film forming step of removing a portion of the first insulating film to expose each of the gate lines, thereby forming a gate insulating film, a source layer forming step of forming a source electrode and a drain electrode on each of the semiconductor layers, a protective film forming step of forming a second insulating film covering the source electrodes and the drain electrodes, and thereafter, removing a portion of the second insulating film to expose of a portion of each drain electrode, thereby forming a protective film, and a pixel electrode forming step of forming a plurality of pixel electrodes arranged in a matrix on the protective film, thereby forming a plurality of auxiliary capacitors each including a portion of the corresponding gate line, the protective film, and the corresponding pixel electrode.

With the above method, in the gate insulating film forming step performed after the semiconductor layer forming step, the first insulating film is formed to cover the gate lines which have been formed in the gate layer forming step, and thereafter, a portion of the first insulating film is removed to expose a portion of each gate line, thereby forming the gate insulating film. In the protective film forming step performed before the pixel electrode forming step, the second insulating film is formed to cover the source and drain electrodes which have been formed in the source layer forming step and a portion of each gate line which has been exposed through the gate insulating film in the gate insulating film forming step, and thereafter, a portion of the second insulating film is removed to expose a portion of each drain electrode, thereby forming the protective film. Therefore, in the auxiliary capacitor (one for each pixel), the insulating film provided between the gate line and the pixel electrode does not includes the gate insulating film which needs to be relatively thick (e.g., about 300-500 nm) for the purpose of the coverage of the gate line and the dielectric strength, and includes only the protective film which has been provided by removing the gate insulating film and is relatively thin (e.g., about 50-300 nm). As a result, the electric capacity per unit area of the auxiliary capacitor is relatively large (in inverse proportion to the thickness of the insulating film). Therefore, in each pixel, the auxiliary capacitor can be designed to have a smaller area, whereby, in the active matrix substrate having the Cs-on-Gate structure, the electric capacity of the auxiliary capacitor can be increased while the decrease in the aperture ratio of the pixel is reduced.

Specifically, in the active matrix substrate having the Cs-on-Gate structure, assuming that the protective film and the gate insulating film are made of the same material, the protective film has a thickness of 50 nm, and the gate insulating film has a thickness of 300 nm, the area of the auxiliary capacitor including the protective film is 1/6 of the area of the auxiliary capacitor including the gate insulating film, according to expression $C=\epsilon S/d$ (C: electric capacity, $\epsilon$: dielectric constant, S: area, and d: thickness).

In the protective film forming step, a portion of the protective film which is included in each of the auxiliary capacitors may be thinner than a portion of the protective film which covers the source and drain electrodes.

With the above method, a portion of the protective film which is included in each of the auxiliary capacitors is relatively thin, and therefore, the electric capacity per unit area of the auxiliary capacitor is further increased.

The protective film forming step may include a resist pattern forming step of forming a photosensitive resin film on the second insulating film, and thereafter, performing a halftone exposure on the photosensitive resin film to form a resist pattern having recessed portions at each of which the corresponding auxiliary capacitor is to be formed, a first etching step of etching the second insulating film exposed through the resist pattern formed in the resist pattern forming step, and a second etching step of reducing a thickness of the resist pattern used in the first etching step by ashing to remove a bottom portion of the recessed portion of the resist pattern, thereby exposing the second insulating film, and etching an upper layer portion of the exposed second insulating film.

With the above method, in the protective film forming step, a halftone photomask is used to form the resist pattern having the recessed portion at which the auxiliary capacitor is to be formed, in the resist pattern forming step, and the second insulating film exposed through the resist pattern is etched in the first etching step, and thereafter, an upper layer portion of the second insulating film which has been exposed by removing the bottom portion of the recessed portion of the resist pattern is etched in the second etching step, thereby forming the protective film. Therefore, the protective film having a relatively thin portion at which the auxiliary capacitor is to be formed can be formed without increasing the number of photomasks.

In the gate insulating film forming step, a channel protective layer may be formed on each of the semiconductor layers.

With the above method, in the gate insulating film forming step, the channel protective layer is formed on each semiconductor layer. Therefore, in the source layer forming step, when the metal film is patterned by etching to form the source and drain electrodes, the etching of a surface of the semiconductor layer can be reduced.

Advantages of the Invention

According to the present invention, the protective film covering the thin film transistor serves as the insulating film of the auxiliary capacitor. Therefore, the electric capacity of the auxiliary capacitor can be increased while the decrease in the aperture ratio of the pixel is reduced.

BRIEF DESCRIPTION OF THE DRAWINGS

FIG. 3 is a plan view of a terminal portion 7 of the active matrix substrate 20a.

FIG. 4 is a plan view of a gate-source connection portion 8 of the active matrix substrate 20a.

FIG. 5 is a cross-sectional view of a pixel portion of the active matrix substrate 20a.

FIG. 6 is a cross-sectional view of a terminal portion 7 of the active matrix substrate 20a.

FIG. 7 is a cross-sectional view of the gate-source connection portion 8 of the active matrix substrate 20a.

FIG. 8 is a cross-sectional view showing a process of manufacturing the active matrix substrate 20a.

DESCRIPTION OF EMBODIMENTS

Embodiments of the present invention will be described in detail hereinafter with reference to the accompanying drawings. Note that the present invention is not limited to the embodiments described below.

<<First Embodiment of the Invention>>

Figure 1:
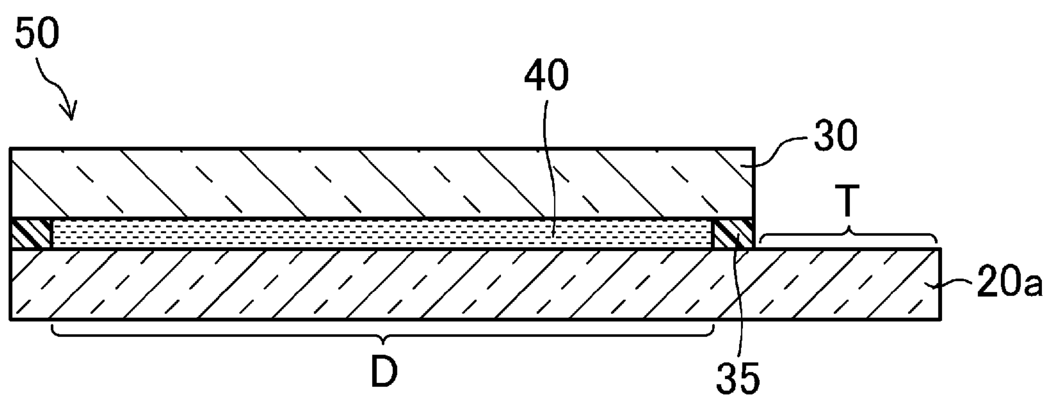
FIG. 1 is a cross-sectional view of a liquid crystal display panel 50 according to a first embodiment.
Figure 2:
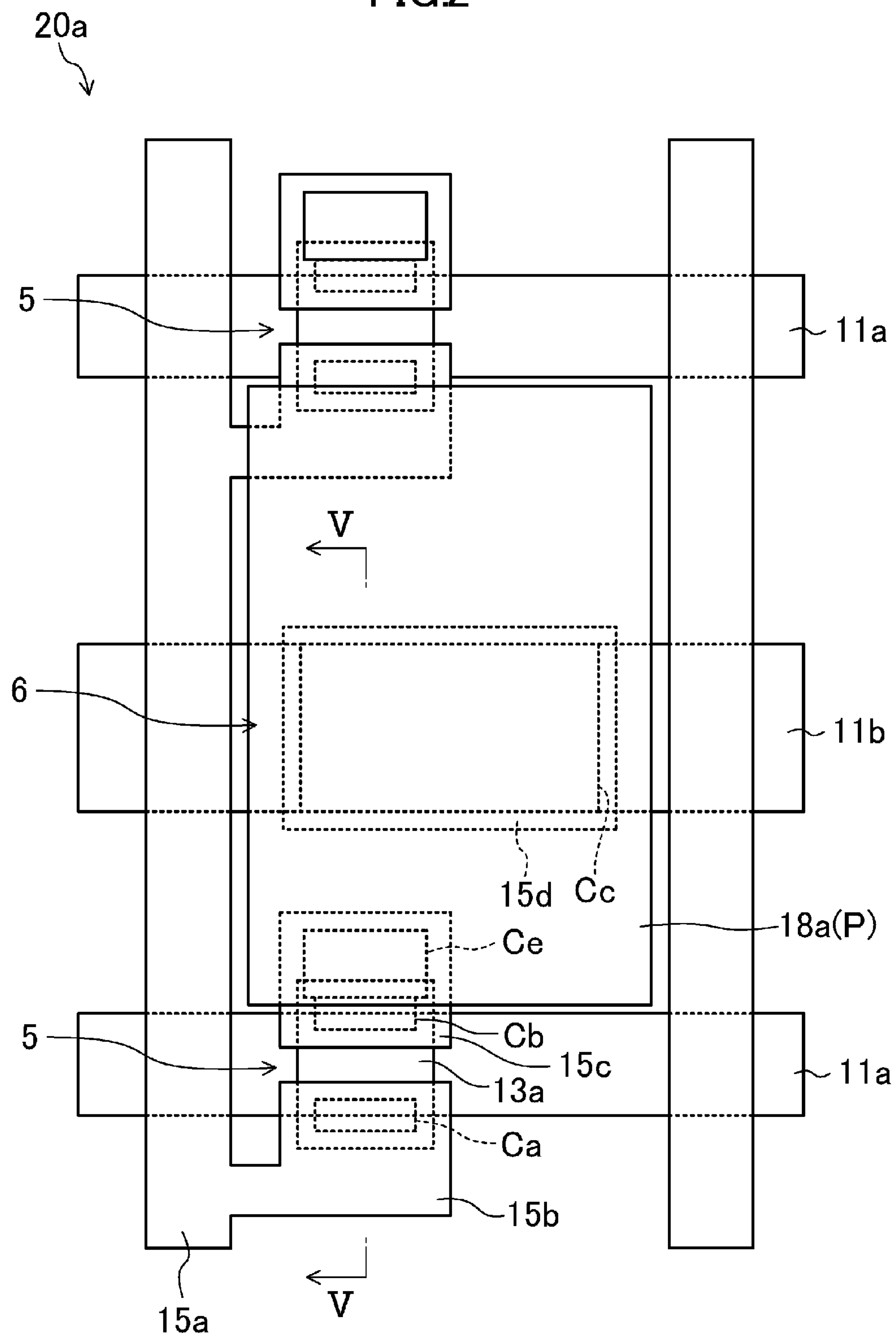
FIG. 2 is a plan view showing a pixel of an active matrix substrate 20a included in the liquid crystal display panel 50.
Figure 3:
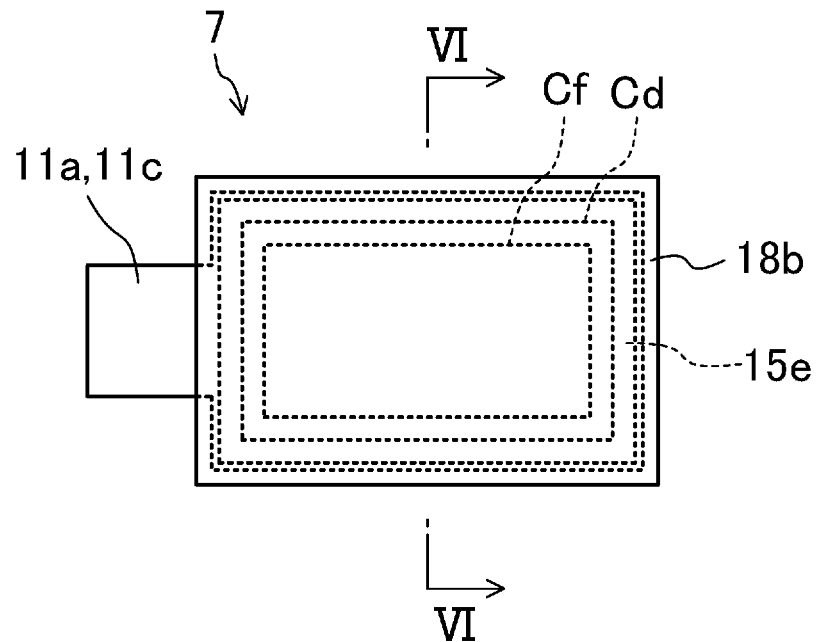
Figure 4:
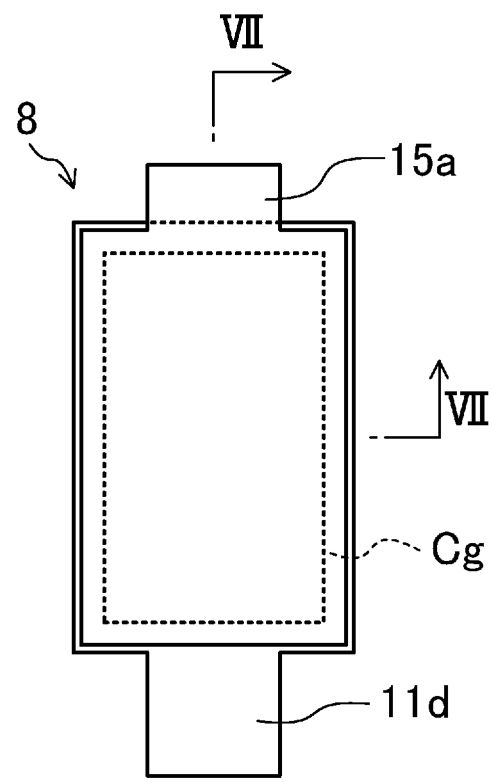
Figure 5:
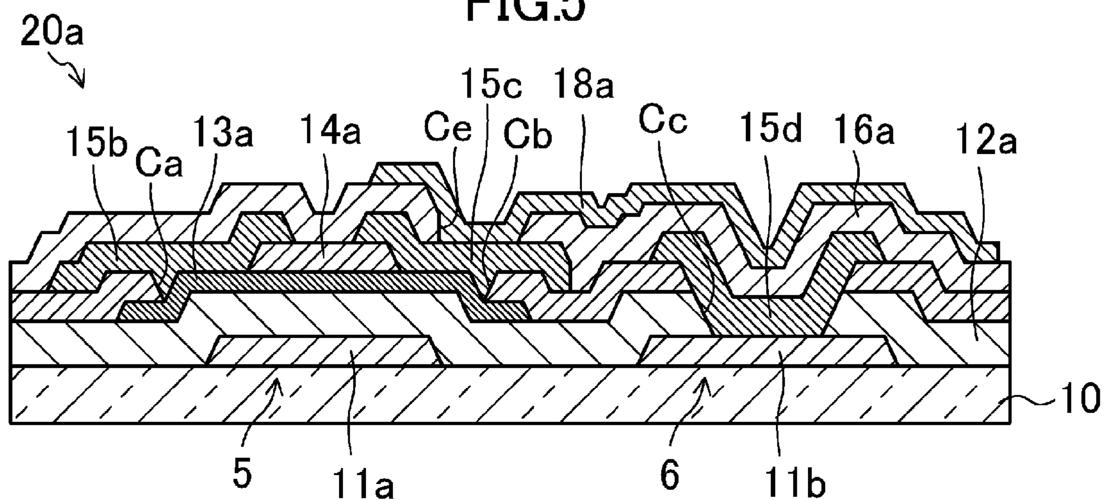
Figure 6:
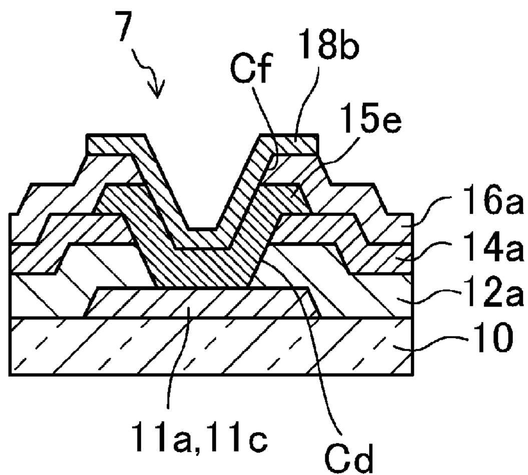
Figure 7:
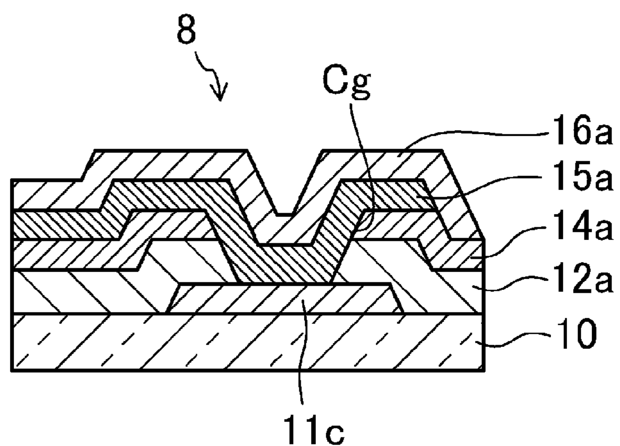

FIGS. 1-9 show an active matrix substrate according to a first embodiment of the present invention and a liquid crystal display panel including the active matrix substrate, and a method for manufacturing the active matrix substrate. Specifically, FIG. 1 is a cross-sectional view of the liquid crystal display panel 50 of this embodiment. FIG. 2 is a plan view showing a pixel of the active matrix substrate 20a included in the liquid crystal display panel 50. FIG. 3 is a plan view of a terminal portion 7 of the active matrix substrate 20a. FIG. 4 is a plan view of a gate-source connection portion 8 of the active matrix substrate 20a. FIG. 5 is a cross-sectional view of a pixel portion of the active matrix substrate 20a, taken along line V-V of FIG. 2. FIG. 6 is a cross-sectional view of the terminal portion 7 of the active matrix substrate 20a, taken along line VI-VI of FIG. 3. FIG. 7 is a cross-sectional view of the gate-source connection portion 8 of the active matrix substrate 20a, taken along line VII-VII of FIG. 4.

As shown in FIG. 1, the liquid crystal display panel 50 includes the active matrix substrate 20a and a counter substrate 30 facing each other, a liquid crystal layer 40 provided between the active matrix substrate 20a and the counter substrate 30, and a sealing member 35 which causes the active matrix substrate 20a and the counter substrate 30 to bond with each other, and is in the shape of a frame in order to enclose the liquid crystal layer 40 between the active matrix substrate 20a and the counter substrate 30. A plurality of pixels P (see FIG. 2) are arranged in a matrix in the liquid crystal display panel 50.

As shown in FIGS. 2 and 5, the active matrix substrate 20a includes a plurality of gate lines 11a provided on an insulating substrate 10 and extending in parallel to each other, a plurality of capacitor lines 11b each provided between the corresponding gate lines 11a and extending in parallel to each other, a plurality of source lines 15a extending in a direction perpendicular to the gate lines 11a and in parallel to each other, a plurality of TFTs 5 provided at respective interconnection portions between the gate lines 11a and the source lines 15a (one TFT 5 is provided for each pixel P), a protective film 16a covering the TFTs 5, a plurality of pixel electrodes 18a arranged in a matrix on the protective film 16a, a plurality of auxiliary capacitors 6 (one for each pixel P), and an alignment film (not shown) covering the pixel electrodes 18a. Thus, the active matrix substrate 20a has the Cs-on-Common structure.

The gate line 11a is extended out from a display region D in which an image is displayed (see FIG. 1) to a terminal region T (see FIG. 1) which is located outside the display region D. As shown in FIGS. 3 and 6, in the terminal region T, the gate line 11a has the terminal portion 7 in which the gate line 11a is connected to a first conductive layer 15e via a contact hole Cd which is formed in a multilayer film of a gate insulating film 12a and a channel protective film 14a, and the first conductive layer 15e is connected to a second conductive layer 18b via a contact hole Cf which is formed in the protective film 16a.

The source line 15a is extended out from the display region D (see FIG. 1). As shown in FIGS. 4 and 7, the source line 15a has the gate-source connection portion 8 in which the source line 15a is connected to a relay interconnect 11c via a contact hole Cg which is formed in a multilayer film of the gate insulating film 12a and the channel protective film 14a. The relay interconnect 11c is extended out in the terminal region T (see FIG. 1) which is located outside the display region D. As shown in FIGS. 3 and 6, in the terminal region T, the relay interconnect 11c has the terminal portion 7 in which the relay interconnect 11c is connected to the first conductive layer 15e via the contact hole Cd formed in the multilayer film of the gate insulating film 12a and the channel protective film 14a, and the first conductive layer 15e is connected to the second conductive layer 18b via the contact hole Cf formed in the protective film 16a.

As shown in FIGS. 2 and 5, the TFT 5 includes a gate electrode (11a) provided on the insulating substrate 10, the gate insulating film 12a covering the gate electrode (11a), an island-like semiconductor layer 13a provided on the gate insulating film 12a directly above the gate electrode (11a), a channel protective layer 14a provided on the semiconductor layer 13a and covering the channel region (not shown), and a source electrode 15b and a drain electrode 15c provided on the semiconductor layer 13a and facing each other with the channel protective layer 14a being interposed between the source electrode 15b and the drain electrode 15c. Here, as shown in FIG. 2, the gate electrode (11a) is a portion of the gate line 11a, and the source electrode 15b is a laterally protruding portion of the source line 15a. As shown in FIGS. 2 and 5, the drain electrode 15c is connected to the pixel electrode 18a via a contact hole Ce which is formed in the protective film 16a. The semiconductor layer 13a is, for example, an oxide semiconductor layer formed of an oxide semiconductor film, such as IGZO (In—Ga—Zn—O), ISiZO (In—Si—Zn—O), IAlZO (In—Al—Zn—O), etc. As shown in FIGS. 2 and 5, the semiconductor layer 13a is connected to the source electrode 15*b* and the drain electrode 15*c* via contact holes Ca and Cb, respectively, which are formed in the channel protective layer 14*a*.

As shown in FIGS. 2 and 5, the auxiliary capacitor 6 includes a conductive layer 15*d* which is connected to the capacitor line 11*b* via a contact hole Cc formed in a multilayer film of the gate insulating film 12*a* and the channel protective layer 14*a*, the protective film 16*a* covering the conductive layer 15*d*, and pixel electrode 18*a* provided on the protective film 16*a*.

The counter substrate 30 includes a black matrix (not shown) with a grid pattern provided on an insulating substrate, a color filter layer (not shown) including color layers (not shown) (e.g., a red layer, a green layer, and a blue layer, etc.) which is provided between each grid bar of the black matrix, a common electrode (not shown) covering the color filter layer, a photospacer (not shown) provided on the common electrode, and an alignment film (not shown) covering the common electrode.

The liquid crystal layer 40 is formed of, for example, a nematic liquid crystal material having electro-optic properties.

In the liquid crystal display panel 50 thus configured, in each pixel P, when a gate signal is sent from a gate driver (not shown) through the gate line 11*a* to the gate electrode (11*a*), so that the TFT 5 is turned on, a source signal is sent from a source driver (not shown) through the source line 15*a* to the source electrode 15*b*, so that predetermined charge is written to the pixel electrode 18*a* through the semiconductor layer 13*a* and the drain electrode 15*c*. In this case, there is a potential difference between each pixel electrode 18*a* of the active matrix substrate 20*a* and the common electrode of the counter substrate 30, and therefore, a predetermined voltage is applied to the liquid crystal layer 40 (i.e., the liquid crystal capacitor of each pixel P) and the auxiliary capacitor 6 connected in parallel to the liquid crystal capacitor. In the liquid crystal display panel 50, in each pixel P, the alignment of the liquid crystal layer 40 is changed, depending on the magnitude of the voltage applied to the liquid crystal layer 40, to adjust the light transmittance of the liquid crystal layer 40, thereby displaying an image.

Figure 8:
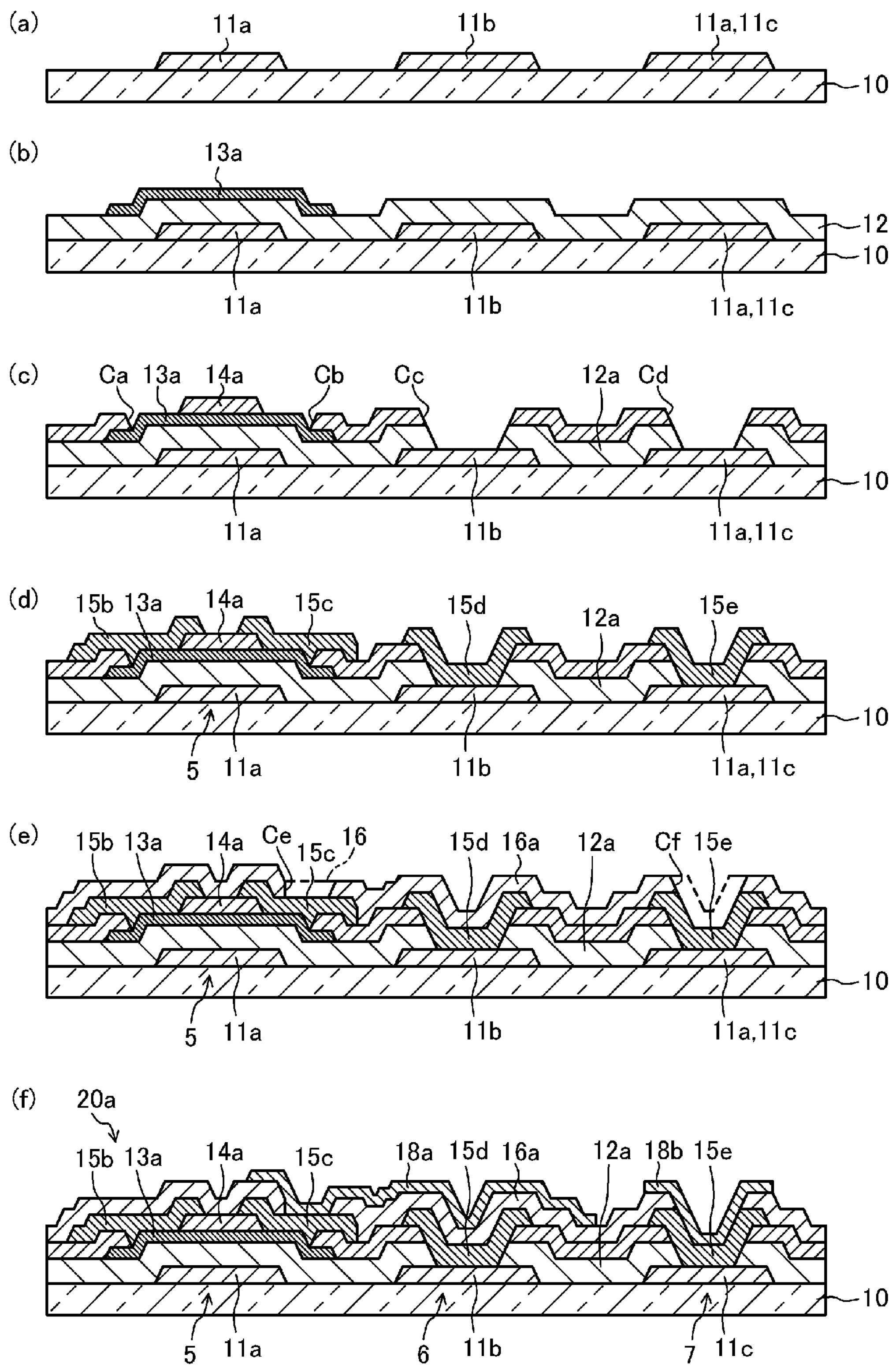
Figure 9:
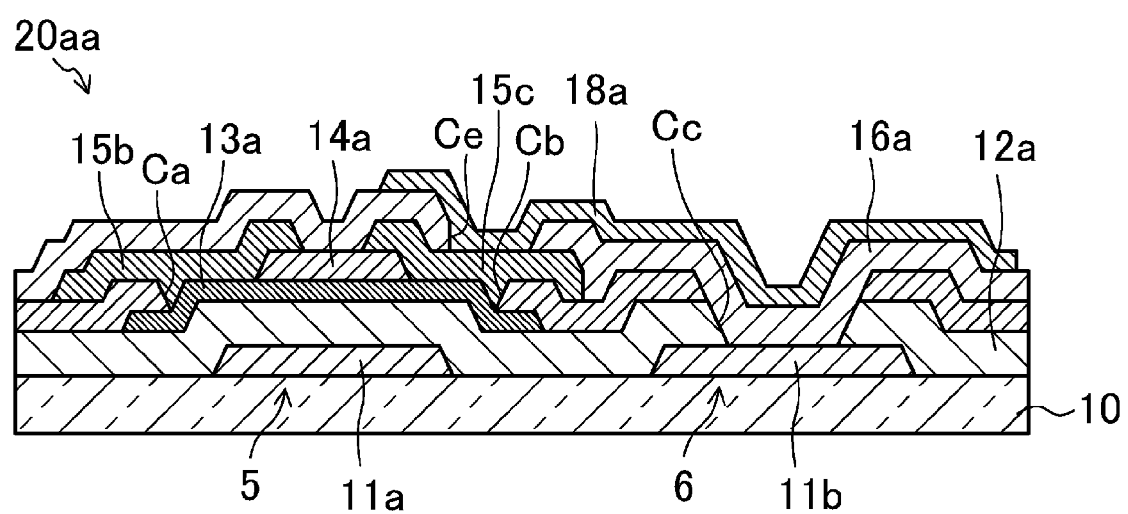
FIG. 9 is a cross-sectional view of a pixel portion of an active matrix substrate 20aa which is a variation.

Next, an example method for manufacturing the liquid crystal display panel 50 of this embodiment will be described with reference to FIG. 8. Here, FIG. 8 is a cross-sectional view showing a process of manufacturing the active matrix substrate 20*a*, and FIG. 9 is a cross-sectional view of a pixel portion of an active matrix substrate 20*aa* which is a variation of the active matrix substrate 20*a*. Note that the manufacturing method of this embodiment includes an active matrix substrate fabricating process, a counter substrate fabricating process, and and a liquid crystal injecting process.

<Active Matrix Substrate Fabricating Process>

Initially, as shown in FIG. 8(*a*), for example, a titanium film (thickness: about 50 nm), an aluminum film (thickness: about 200 nm), and a titanium film (thickness: about 100 nm), etc. are successively formed on the entire insulating substrate 10 (e.g., a glass substrate etc.) by sputtering to form a first metal film, and thereafter, photolithography, dry etching of the first metal film, resist removal, and cleaning are performed to form the gate line 11*a*, the capacitor line 11*b*, and the relay interconnect 11*c* (gate layer forming step).

Next, as shown in FIG. 8(*b*), on the entire substrate on which the gate line 11*a*, the capacitor line 11*b*, and the relay interconnect 11*c* have been formed, a first insulating film 12 (thickness: about 300-500 nm), such as a silicon oxide film etc., is formed by chemical vapor deposition (CVD), and thereafter, an IGZO oxide semiconductor film (thickness: about 30-300 nm) is formed by sputtering, and thereafter, photolithography, wet etching of the oxide semiconductor film, resist removal, and cleaning are performed to form the semiconductor layer 13*a* (semiconductor layer forming step). Note that, in this embodiment, the first insulating film 12 has been illustrated as a monolayer film. Alternatively, for example, the first insulating film 12 may be a multilayer film including a silicon nitride film (thickness: about 200-500 nm) as the lower layer and a silicon oxide film (thickness: about 20-150 nm) as the upper layer.

Moreover, as shown in FIG. 8(*c*), on the entire substrate on which the semiconductor layer 13*a* has been formed, a third insulating film (thickness: about 50-200 nm), such as a silicon oxide film etc., is formed by CVD, and thereafter, photolithography, dry etching of the third insulating film and a multilayer film of the first and third insulating films, resist removal, and cleaning are performed to form the contact holes Ca, Cb, Cc, Cd, and Cg (see FIGS. 4 and 7), thereby forming the channel protective layer 14*a* and the gate insulating film 12*a* (gate insulating film forming step). Note that, in this embodiment, the third insulating film has been illustrated as a monolayer film. Alternatively, for example, the third insulating film may be a multilayer film including a silicon oxide film as the lower layer and a silicon nitride film as the upper layer.

Thereafter, as shown in FIG. 8(*d*), on the entire substrate on which the channel protective layer 14*a* and the gate insulating film 12*a*, etc. have been formed, for example, a titanium film (thickness; about 50 nm), an aluminum film (thickness: about 200 nm), and a titanium film (thickness: about 100 nm), etc. are successively formed by sputtering to form a second metal film, and thereafter, photolithography, dry etching of the second metal film, resist removal, and cleaning are performed to form the source line 15*a* (see FIG. 2), the source electrode 15*b*, the drain electrode 15*c*, the conductive layer 15*d*, and the first conductive layer 15*e* each having a thickness of about 350 nm, thereby forming the TFT 5 and the gate-source connection portion 8 (source layer forming step). Here, if the first and second metal films have a high etch selectivity ratio (e.g., the first metal film is a multilayer film of a titanium film/an aluminum film/a titanium film as described above, and the second metal film is a monolayer or multilayer film of a molybdenum film, an aluminum film, a copper film, etc.) and wet etching is performed on the second metal film (about 200 nm), the conductive layer 15*d* and the first conductive layer 15*e* may not be required (see the active matrix substrate 20*aa* of FIG. 9). Note that, in this case, as shown in FIG. 9, the auxiliary capacitor 6 includes the capacitor line 11*b*, the protective film 16*a* covering a portion of the capacitor line 11*b*, and the pixel electrode 18*a* provided on the protective film 16*a*.

Next, as shown in FIG. 8(*e*), on the entire substrate on which the TFT 5 and the gate-source connection portion 8 etc. have been formed, a second insulating film 16, such as a silicon oxide film etc., having a thickness of about 50-300 nm is formed by CVD, and thereafter, photolithography, dry etching of the second insulating film 16, resist removal, and cleaning are performed to form the contact holes Ce and Cf, thereby forming the protective film 16*a* (protective film forming step). Note that, in this embodiment, the second insulating film 16 has been illustrated as a monolayer film. Alternatively, for example, the second insulating film 16 may be a multilayer film including a silicon oxide film (thickness: about 50-150 nm) as the lower layer and a silicon nitride film (thickness: about 50-200 nm) as the upper layer.

Thereafter, as shown in FIG. 8(*f*), on the entire substrate on which the protective film 16*a* has been formed, a transparent conductive film made of, for example, indium tin oxide (ITO) is formed by sputtering, and thereafter, photolithography, dry etching of the transparent conductive film, resist removal, and cleaning are performed to form the pixel electrode 18*a* and the second conductive layer 18*b* each having a thickness of about 100 nm, thereby forming the auxiliary capacitor 6 and the terminal portion 7 (pixel electrode forming step).

Finally, on the entire substrate on which the pixel electrode 18*a* and the second conductive layer 18*b* have been formed, a polyimide resin is applied by a printing method, and thereafter, an alignment film having a thickness of about 100 nm is formed by a rubbing treatment.

Thus, the active matrix substrate 20*a* can be fabricated.

<Counter Substrate Fabricating Process>

Initially, for example, an acrylic photosensitive resin in which a black pigment, such as carbon particles etc., is dispersed is applied by spin coating onto an entire insulating substrate, such as a glass substrate etc. The applied photosensitive resin is exposed to light through a photomask and then developed, thereby forming a black matrix having a thickness of about 1.5 μm.

Next, on the entire substrate on which the black matrix has been formed, a red-, green-, or blue-colored acrylic photosensitive resin is applied by spin coating, and the applied photosensitive resin is exposed to light through a photomask and then developed to perform patterning, thereby forming a color layer with a selected color (e.g., a red color layer) having a thickness of about 2.0 μm. Moreover, by repeating a similar process for the two other colors, color layers with the two other colors (e.g., a green color layer and a blue color layer) each having a thickness of about 2.0 μm are formed. As a result, a color filter layer is formed.

Moreover, on the substrate on which the color filter layer has been formed, a transparent conductive film made of, for example, ITO is formed by sputtering to form a common electrode having a thickness of about 100 nm.

Thereafter, on the entire substrate on which the common electrode has been formed, a photosensitive resin is applied by spin coating, and the applied photosensitive resin is exposed to light through a photomask and then developed, thereby forming a photospacer having a thickness of about 4 μm.

Finally, on the entire substrate on which the photospacer has been formed, a polyimide resin is applied by a printing method, and thereafter, a rubbing treatment is performed, thereby forming an alignment film having a thickness of about 100 nm.

Thus, the counter substrate 30 can be fabricated.

<Liquid Crystal Injecting Process>

Initially, on the counter substrate 30 which has been formed in the counter substrate fabricating process, the frame-like sealing member 35 made of, for example, a UV and thermal curing resin is formed using, for example, a dispenser.

Next, a liquid crystal material is dropped into a region inside the sealing member 35 of the counter substrate 30 on which the sealing member 35 has been formed.

Moreover, the counter substrate 30 on which the liquid crystal material has been dropped, and the active matrix substrate 20*a* which has been formed in the active matrix substrate fabricating process, are joined with each other under reduced pressure. Thereafter, the counter substrate 30 and the active matrix substrate 20*a* thus joined with each other are exposed to the atmosphere so that pressure is applied on the front and rear surfaces of the two-substrate structure.

Finally, the sealing member 35 interposed between the counter substrate 30 and the active matrix substrate 20*a* joined with each other is irradiated with UV light and then heated, whereby the sealing member 35 is cured.

Thus, the liquid crystal display panel 50 of this embodiment can be fabricated.

As described above, according to the active matrix substrate 20*a* of this embodiment and the liquid crystal display panel 50 including the active matrix substrate 20*a*, and the method for manufacturing the active matrix substrate 20*a*, in the gate insulating film forming step performed after the semiconductor layer forming step, the first insulating film 12 is formed to cover the capacitor lines 11*b* and the gate lines 11*a* which have been formed in the gate layer forming step, and thereafter, a portion of the first insulating film 12 is removed to expose each capacitor line 11*b*, thereby forming the gate insulating film 12*a*. In the protective film forming step performed before the pixel electrode forming step, the second insulating film 16 is formed to cover the source electrode 15*b* and the drain electrode 15*c* which have been formed in the source layer forming step and the capacitor line 11*b* which has been exposed through the gate insulating film 12*a* in the gate insulating film forming step, and thereafter, a portion of the second insulating film 16 is removed to expose a portion of the drain electrode 15*c*, thereby forming the protective film 16*a*. Therefore, in the auxiliary capacitor 6 (one for each pixel P), the insulating film provided between the capacitor line 11*b* and the pixel electrode 18*a* does not include the gate insulating film 12*a* which needs to be relatively thick (e.g., about 300-500 nm) for the purpose of the coverage of the gate line 11*a* and the dielectric strength, and includes only the protective film 16*a* which has been provided by removing the gate insulating film 12*a* and is relatively thin (e.g., about 50-300 nm). As a result, the electric capacity per unit area of the auxiliary capacitor 6 is relatively large (in inverse proportion to the thickness of the insulating film). Therefore, in each pixel P, the auxiliary capacitor 6 can be designed to have a smaller area, whereby, in the active matrix substrate 20*a* having the Cs-on-Common structure and the liquid crystal display panel 50 including the active matrix substrate 20*a*, the electric capacity of the auxiliary capacitor 6 can be increased while the decrease in the aperture ratio of the pixel P is reduced.

Also, according to the active matrix substrate 20*a* of this embodiment and the liquid crystal display panel 50 including the active matrix substrate 20*a*, the conductive layer 15*d* which is provided in the same layer in which the source electrode 15*b* and the drain electrode 15*c* of the TFT 5 are provided and is formed of the same material of which the source electrode 15*b* and the drain electrode 15*c* of the TFT 5 are formed, is provided between the capacitor line 11*b* and the protective film 16*a* of the auxiliary capacitor 6. Therefore, although the gate material for the gate line 11*a* and the capacitor line 11*b* is similar to the source material for the source electrode 15*b* and the drain electrode 15*c*, and therefore, the combination of the gate material and the source material has a low etch selectivity ratio, the auxiliary capacitor 6 can be configured without providing an additional manufacturing step.

Also, according to the active matrix substrate 20*a* of this embodiment and the liquid crystal display panel 50 including the active matrix substrate 20*a*, the TFT 5 includes the semiconductor layer 13*a* formed of an oxide semiconductor film. Therefore, for example, the $N^+$ amorphous silicon layer for connecting to the source electrode 15*b* and the drain electrode 15*c* is no longer required, and therefore, the TFT 5 can have a simpler structure and satisfactory characteristics, such as a high mobility, a high reliability, and a low off current, etc.

According to the method for manufacturing the active matrix substrate 20*a* of this embodiment, in the gate insulating film forming step, the channel protective layer 14*a* is formed on the semiconductor layer 13*a*. Therefore, in the source layer forming step, when the second metal film is patterned by etching to form the source electrode 15*b* and the drain electrode 15*c*, the etching of the channel region in the surface of the semiconductor layer 13*a* can be reduced.

<<Second Embodiment of the Invention>>

Figure 10:
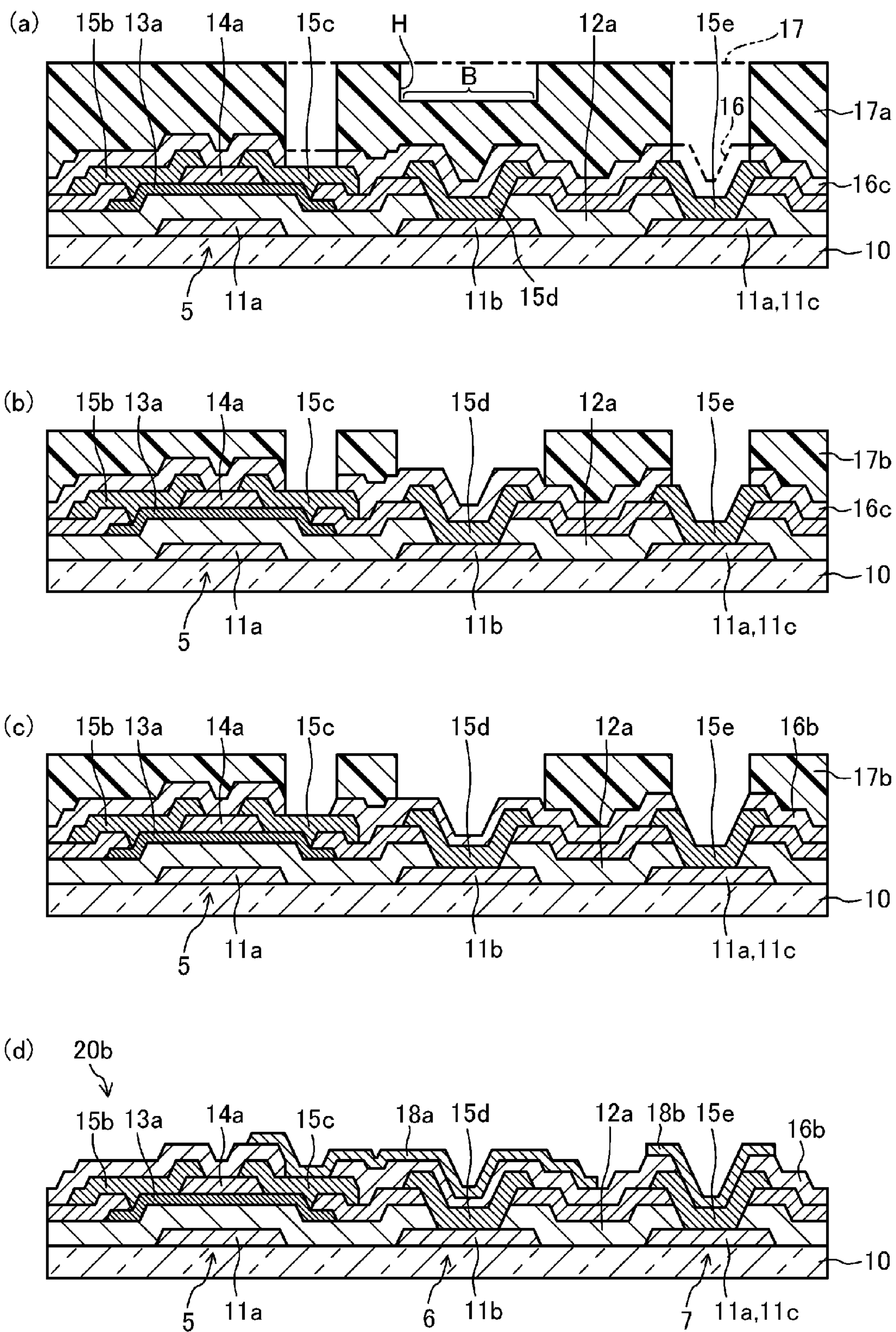
FIG. 10 is a cross-sectional view showing a process of manufacturing an active matrix substrate 20b included in a liquid crystal display device according to a second embodiment.

FIG. 10 is a cross-sectional view showing a process of manufacturing an active matrix substrate 20*b* included in a liquid crystal display device according to this embodiment. Note that, in embodiments described below, the same parts as those of FIGS. 1-9 are indicated by the same reference characters and will not be described in detail.

In the first embodiment, the active matrix substrate 20*a* including the protective film 16*a* having a single thickness has been illustrated. In this embodiment, the active matrix substrate 20*b* which includes a protective film 16*b* having two thicknesses will be illustrated.

The liquid crystal display panel of this embodiment includes the active matrix substrate 20*b* and a counter substrate 30 (see FIG. 1) facing each other, and a liquid crystal layer 40 (see FIG. 1) provided between the active matrix substrate 20*b* and the counter substrate 30.

As shown in FIG. 10(*d*), the active matrix substrate 20*b* includes a plurality of gate lines 11*a* provided on the insulating substrate 10 and extending in parallel to each other, a plurality of capacitor lines 11*b* each provided between the corresponding gate lines 11*a* and extending in parallel to each other, a plurality of source lines 15*a* (see FIG. 2) extending in a direction perpendicular to the gate lines 11*a* and in parallel to each other, a plurality of TFTs 5 provided at respective interconnection portions between the gate lines 11*a* and the source lines 15*a* (one TFT 5 is provided for each pixel P), a protective film 16*b* covering the TFTs 5, a plurality of pixel electrodes 18*a* arranged in a matrix on the protective film 16*b*, a plurality of auxiliary capacitors 6 (one for each pixel P), and an alignment film (not shown) covering the pixel electrodes 18*a*.

The protective film 16*b* has a portion (e.g., a thickness of 150 nm) which is included in the auxiliary capacitors 6 and a portion (e.g., a thickness of 300 nm) which covers the TFTs 5.

Next, an example method for manufacturing the active matrix substrate 20*b* of this embodiment will be described with reference to FIG. 10. Note that, in the manufacturing method of this embodiment, only the protective film forming step of the active matrix substrate fabricating process of the first embodiment is changed, and therefore, the protective film forming step will be mainly described.

Initially, as shown in FIG. 10(*a*), on the entire substrate on which the TFTs 5 have been formed by the source layer forming step of the active matrix substrate fabricating process of the first embodiment, the second insulating film 16 formed of, for example, a silicon oxide film and having a thickness of about 300 nm is formed by CVD, and a photosensitive resin 17 is applied by spin coating, and the applied photosensitive resin 17 is exposed to light through a halftone photomask and then developed, thereby forming a first resist pattern 17*a* having a recessed portion H at which the auxiliary capacitor 6 is to be formed (resist pattern forming step).

Next, as shown in FIG. 10(*a*), the second insulating film 16 which is exposed through the first resist pattern 17*a* which has been formed in the resist pattern forming step is removed by dry etching to form a protective film formation film 16*c* (first etching step).

Moreover, as shown in FIG. 10(*b*), a thickness of the first resist pattern 17*a* which has been used in the first etching step is reduced by ashing to remove a bottom portion B of the recessed portion H of the first resist pattern 17*a*, thereby forming a second resist pattern 17*b*, and thereafter, as shown in FIG. 10(*c*), an upper layer portion of the protective film formation film 16*c* which is the second insulating film exposed through the second resist pattern 17*b* is removed by dry etching, thereby forming the protective film 16*b* (second etching step).

Next, the second resist pattern 17*b* which was used in the second etching step is removed, followed by cleaning, and thereafter, the pixel electrode forming step of the first embodiment is performed. Thus, the active matrix substrate 20*b* can be manufactured.

As described above, according to the active matrix substrate 20*b* of this embodiment and the liquid crystal display panel including the active matrix substrate 20*b*, and the method for manufacturing the active matrix substrate 20*b*, the portion of the protective film 16*b* at which the auxiliary capacitor 6 is formed is thinner than that of the first embodiment, and therefore, the electric capacity per unit area of the auxiliary capacitor 6 can be further increased, and in each pixel P, the auxiliary capacitor 6 can be designed to have an even smaller area. As a result, in the active matrix substrate 20*b* having the Cs-on-Common structure and the liquid crystal display panel including the active matrix substrate 20*b*, the electric capacity of the auxiliary capacitor 6 can be increased while the decrease in the aperture ratio of the pixel P is further reduced.

Also, according to the method for manufacturing the active matrix substrate 20*b* of this embodiment, in the protective film forming step, a halftone photomask is used to form the first resist pattern 17*a* having the recessed portion H at which the auxiliary capacitor 6 is to be formed, in the resist pattern forming step, and the second insulating film 16 exposed through the first resist pattern 17*a* is etched in the first etching step, and thereafter, an upper layer portion of the protective film formation film 16*c* which is exposed through the second resist pattern 17*b* which has been formed by removing the bottom portion B of the recessed portion H of the first resist pattern 17*a* is etched in the second etching step, thereby forming the protective film 16*b*. Therefore, the protective film 16*b* having a relatively thin portion at which the auxiliary capacitor 6 is to be formed can be formed without increasing the number of photomasks.

<<Third Embodiment of the Invention>>

Figure 11:
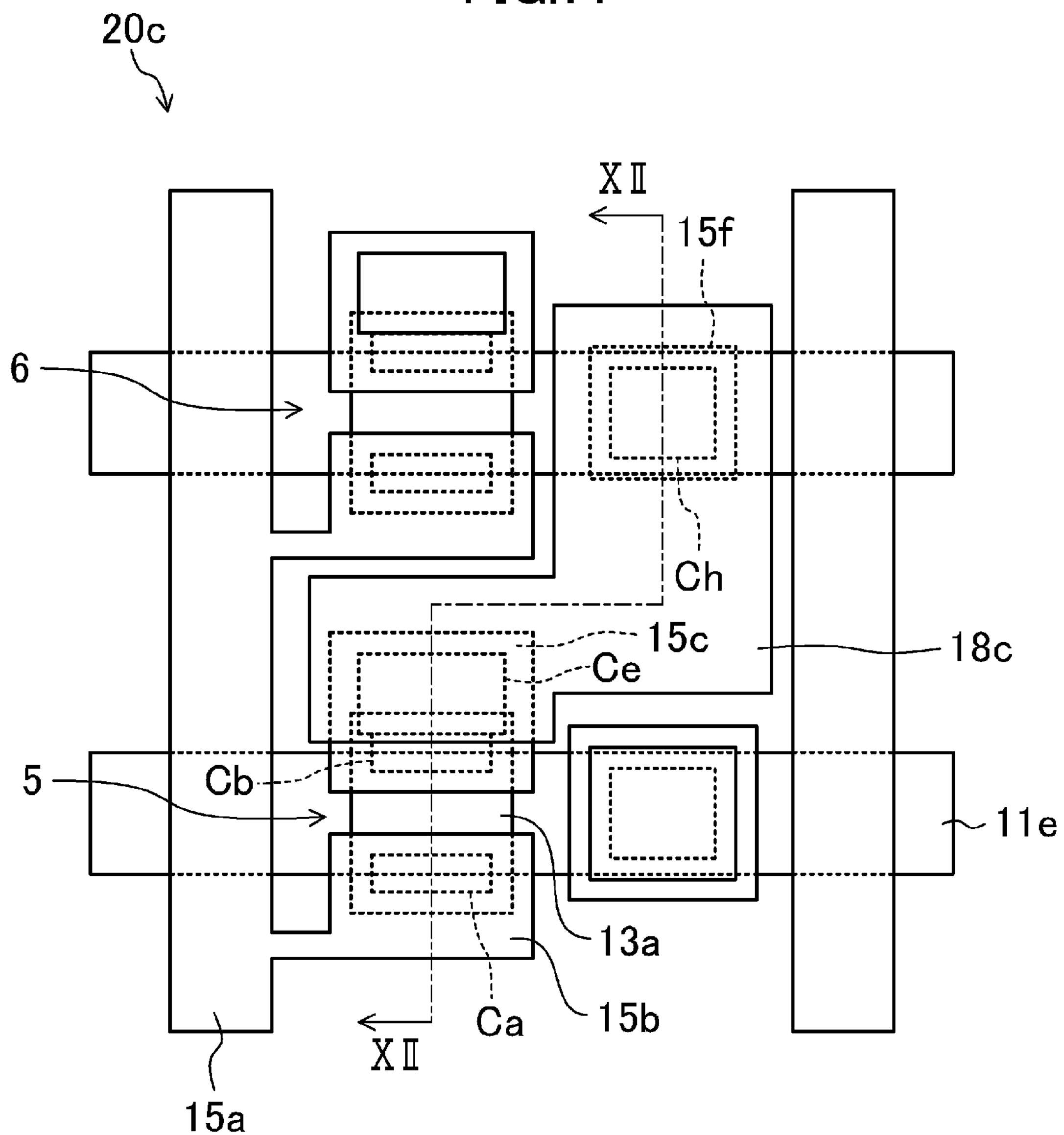
FIG. 11 is a plan view of an active matrix substrate 20c included in a liquid crystal display device according to a third embodiment.
Figure 12:
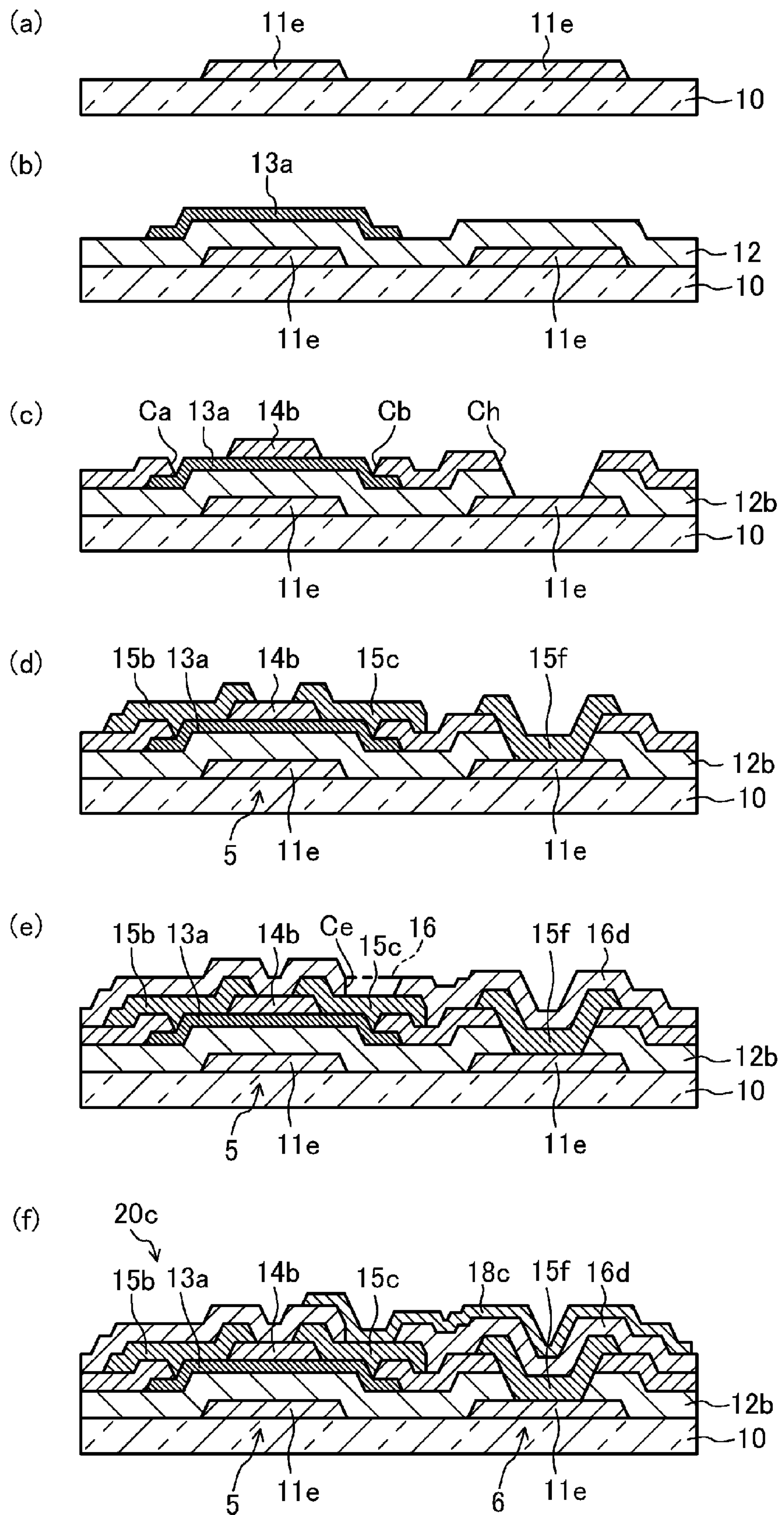
FIG. 12 is a cross-sectional view showing a process of manufacturing the active matrix substrate 20c.
Figure 13:
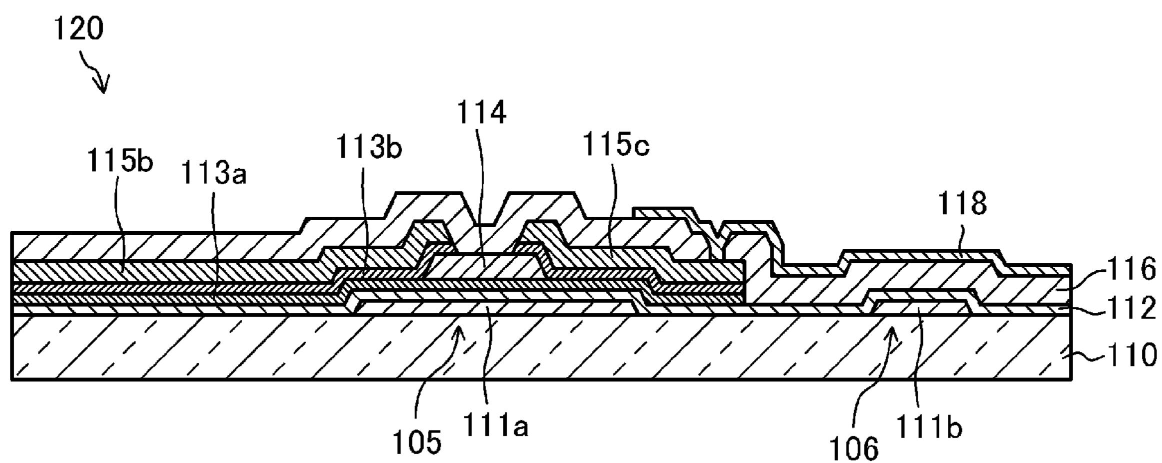
FIG. 13 is a cross-sectional view of a conventional active matrix substrate 120.

FIG. 11 is a plan view of an active matrix substrate 20*c* included in a liquid crystal display device according to this embodiment. FIG. 12 is a cross-sectional view showing a process of manufacturing the active matrix substrate 20*c*. Note that FIG. 12(*f*) is a cross-sectional view of the active matrix substrate 20*c*, taken along line XII-XII of FIG. 11.

In the first and second embodiments, the active matrix substrates 20*a* and 20*b* having the Cs-on-Common structure have been illustrated. In this embodiment, the active matrix substrate 20*c* having the Cs-on-Gate structure will be illustrated.

The liquid crystal display panel of this embodiment includes the active matrix substrate 20*c* and a counter substrate 30 (see FIG. 1) facing each other, and a liquid crystal layer 40 (see FIG. 1) provided between the active matrix substrate 20*c* and the counter substrate 30.

As shown in FIGS. 11 and 12(*f*), the active matrix substrate 20*c* includes a plurality of gate lines 11*e* which are provided on an insulating substrate 10 and extend in parallel to each other, and also each function as a capacitor line, a plurality of source lines 15*a* which extend in a direction perpendicular to the gate lines 11*e* and in parallel to each other, a plurality of TFTs 5 which are provided at respective interconnection portions between the gate lines 11*e* and the source lines 15*a* (one TFT 5 is provided for each pixel P), a protective film 16*d* which covers the TFTs 5, a plurality of pixel electrodes 18*c* which are arranged in a matrix on the protective film 16*d* and are connected to the respective corresponding TFTs 5, a plurality of auxiliary capacitors 6 (one for each pixel P), and an alignment film (not shown) which covers the pixel electrodes 18*c*. Thus, the active matrix substrate 20*c* has the Cs-on-Gate structure.

As shown in FIGS. 11 and 12(*f*), the auxiliary capacitor 6 includes a conductive layer 15*f* which is connected to the gate line 11*e* via a contact hole Ch which is formed in a multilayer film of a gate insulating film 12*b* and a channel protective layer 14*b*, the protective film 16*d* covering the conductive layer 15*f*, and the pixel electrode 18*c* provided on the protective film 16*d*.

Next, an example method for manufacturing the active matrix substrate 20*c* of this embodiment will be described with reference to FIG. 12.

Initially, as shown in FIG. 12(*a*), for example, a titanium film (thickness: about 50 nm), an aluminum film (thickness: about 200 nm), and a titanium film (thickness: about 100 nm), etc. are successively formed on the entire insulating substrate 10 (e.g., a glass substrate etc.) by sputtering to form a first metal film, and thereafter, photolithography, dry etching of the first metal film, resist removal, and cleaning are performed to form the gate line 11*e* (gate layer forming step).

Next, as shown in FIG. 12(*b*), on the entire substrate on which the gate line 11*e* has been formed, a first insulating film 12 (thickness: about 200-500 nm), such as a silicon oxide film etc., is formed by CVD, and thereafter, for example, an IGZO oxide semiconductor film (thickness: about 30-300 nm) is formed by sputtering, and thereafter, photolithography, dry etching of the oxide semiconductor film, resist removal, and cleaning are performed to form the semiconductor layer 13*a* (semiconductor layer forming step).

Moreover, as shown in FIG. 12(*c*), on the entire substrate on which the semiconductor layer 13*a* has been formed, a third insulating film (thickness: about 50-200 nm), such as a silicon oxide film etc., is formed by CVD, and thereafter, photolithography, dry etching of the third insulating film and a multilayer film of the first insulating film 12 and the third insulating film, resist removal, and cleaning are performed to form contact holes Ca, Cb, and Ch, to form the channel protective layer 14*b* and the gate insulating film 12*b* (gate insulating film forming step).

Thereafter, as shown in FIG. 12(*d*), on the entire substrate on which the channel protective layer 14*b* and the gate insulating film 12*b*, etc. have been formed, for example, a titanium film (thickness; about 50 nm), an aluminum film (thickness: about 200 nm), and a titanium film (thickness: about 100 nm), etc. are successively formed by sputtering to form a second metal film, and thereafter, photolithography, dry etching of the second metal film, resist removal, and cleaning are performed to form the source line 15*a* (see FIG. 11), the source electrode 15*b*, the drain electrode 15*c*, and the conductive layer 15*f* each having a thickness of about 350 nm, thereby forming the TFT 5 (source layer forming step).

Next, as shown in FIG. 12(*e*), on the entire substrate on which the TFT 5 etc. have been formed, a second insulating film 16, such as a silicon oxide film etc., having a thickness of about 50-300 nm is formed by CVD, and thereafter, photolithography, dry etching of the second insulating film 16, resist removal, and cleaning are performed to form a contact hole Ce, thereby forming the protective film 16*d* (protective film forming step).

Thereafter, as shown in FIG. 12(*f*), on the entire substrate on which the protective film 16*d* has been formed, a transparent conductive film made of, for example, ITO is formed by sputtering, and thereafter, photolithography, dry etching of the transparent conductive film, resist removal, and cleaning are performed to form the pixel electrode 18*c* having a thickness of about 100 nm, thereby forming the auxiliary capacitor 6 (pixel electrode forming step).

Finally, on the entire substrate on which the pixel electrode 18*c* has been formed, a polyimide resin is applied by a printing method, and thereafter, an alignment film having a thickness of about 100 nm is formed by a rubbing treatment.

Thus, the active matrix substrate 20*c* can be fabricated.

As described above, according to the active matrix substrate 20*c* of this embodiment and the liquid crystal display panel including the active matrix substrate 20*c*, and the method for manufacturing the active matrix substrate 20*c*, in the gate insulating film forming step performed after the semiconductor layer forming step, the first insulating film 12 is formed to cover the gate lines 11*e* which have been formed in the gate layer forming step, and thereafter, a portion of the first insulating film 12 is removed to expose a portion of each gate line 11*e*, thereby forming the gate insulating film 12*b*. In the protective film forming step performed before the pixel electrode forming step, the second insulating film 16 is formed to cover the source electrode 15*b* and the drain electrode 15*c* which have been formed in the source layer forming step and a portion of each gate line 11*e* which has been exposed through the gate insulating film 12*b* in the gate insulating film forming step, and thereafter, a portion of the second insulating film 16 is removed to expose a portion of the drain electrode 15*c*, thereby forming the protective film 16*d*. Therefore, in the auxiliary capacitor 6 (one for each pixel P), the insulating film provided between the gate line 11*e*, which functions as a capacitor line, and the pixel electrode 18*c* does not includes the gate insulating film 12*b* which needs to be relatively thick (e.g., about 300-500 nm) for the purpose of the coverage of the gate line 11*e* and the dielectric strength, and includes only the protective film 16*d* which has been provided by removing the gate insulating film 12*b* and is relatively thin (e.g., about 50-300 nm). As a result, the electric capacity per unit area of the auxiliary capacitor 6 is relatively large (in inverse proportion to the thickness of the insulating film). Therefore, in each pixel P, the auxiliary capacitor 6 can be designed to have a smaller area, whereby, in the active matrix substrate 20*c* having the Cs-on-Gate structure and the liquid crystal display panel including the active matrix substrate 20*c*, the electric capacity of the auxiliary capacitor 6 can be increased while the decrease in the aperture ratio of the pixel P is reduced.

Note that, in the second embodiment, an example has been illustrated in which a protective film having two thicknesses is provided in the active matrix substrate 20*a* having the Cs-on-Common structure of the first embodiment. Alternatively, the protective film having two thicknesses of the second embodiment may be employed in the active matrix substrate 20*c* having the Cs-on-Gate structure of the third embodiment.

In the above embodiments, an active matrix substrate including a TFT including an oxide semiconductor layer has been illustrated. The present invention is also applicable to an active matrix substrate including a TFT including a semiconductor layer made of amorphous silicon or polysilicon, etc.

INDUSTRIAL APPLICABILITY

As described above, according to the present invention, the electric capacity of the auxiliary capacitor can be increased while the decrease in the aperture ratio of the pixel is reduced. Therefore, the present invention is useful for an active matrix liquid crystal display panel including a TFT.

DESCRIPTION OF REFERENCE CHARACTERS

B Bottom Portion
H Recessed Portion
P Pixel
5 TFT
11*a*, 11*e* Gate Line
11*b*, 11*e* Capacitor Line
12 First Insulating Film
12*a*, 12*b* Gate Insulating Film
13*a* Semiconductor Layer (Oxide Semiconductor Layer)
14*a*, 14*b* Channel Protective Layer
15*d*, 15*f* Conductive Layer
16 Second Insulating Film
16*a*, 16*b*, 16*d* Protective Film
17 Photosensitive Resin Film
17*a* First Resist Pattern
17*b* Second Resist Pattern
18*a*, 18*c* Pixel Electrode
20*a*-20*c* Active Matrix Substrate
30 Counter Substrate
40 Liquid Crystal Layer
50 Liquid Crystal Display Panel

The invention claimed is:

1. An active matrix substrate comprising:
a plurality of pixels arranged in a matrix;
a plurality of capacitor lines extending in one of directions in which the pixels are aligned and in parallel to each other;
a plurality of thin film transistors, one for each of the pixels;
a protective film covering the thin film transistors;
a plurality of pixel electrodes arranged in a matrix on the protective film and connected to the respective corresponding thin film transistors; and
a plurality of auxiliary capacitors, one for each of the pixels, wherein
each of the auxiliary capacitors includes the corresponding capacitor line, the corresponding pixel electrode, and the protective film between the corresponding capacitor line and the corresponding pixel electrode, and
in a portion in which each of the plurality of auxiliary capacitors is provided, a gate insulating film forming each of the plurality of thin film transistors is not provided.

2. The active matrix substrate of claim 1, wherein
a gate line connected to a corresponding one of the plurality of thin film transistors is provided between adjacent ones of the capacitor lines and extends along a corresponding one of the plurality of capacitor lines.

3. A method for manufacturing the active matrix substrate of claim 2, comprising:
a gate layer forming step of forming, on a substrate, the plurality of capacitor lines and the gate lines;
a semiconductor layer forming step of forming a first insulating film covering the capacitor lines and the gate lines, and thereafter, forming a plurality of semiconductor layers, which form the respective corresponding one of the plurality of thin film transistors, directly above the respective corresponding gate lines;
a gate insulating film forming step of removing a portion of the first insulating film to expose each of the capacitor lines, thereby forming a gate insulating film;
a source layer forming step of forming a source electrode and a drain electrode, which form each of the plurality of thin film transistors, on each of the semiconductor layers;
a protective film forming step of forming a second insulating film covering the source electrodes and the drain electrodes, and thereafter, removing a portion of the second insulating film to expose of a portion of each of the drain electrodes, thereby forming a protective film; and
a pixel electrode forming step of forming a plurality of pixel electrodes arranged in a matrix on the protective film, thereby forming a plurality of auxiliary capacitors each including the corresponding capacitor line, the protective film, and the corresponding pixel electrode.

4. The method of claim 3, wherein
in the protective film forming step, a portion of the protective film which is included in each of the auxiliary capacitors is thinner than a portion of the protective film which covers the source and drain electrodes.

5. The method of claim 4, wherein
the protective film forming step includes a resist pattern forming step of forming a photosensitive resin film on the second insulating film, and thereafter, performing a halftone exposure on the photosensitive resin film to form a resist pattern having recessed portions at each of which the corresponding auxiliary capacitor is to be formed, a first etching step of etching the second insulating film exposed through the resist pattern formed in the resist pattern forming step, and a second etching step of reducing a thickness of the resist pattern used in the first etching step by ashing to remove a bottom portion of the recessed portion of the resist pattern, thereby exposing the second insulating film, and etching an upper layer portion of the exposed second insulating film.

6. The method of claim 3, wherein
in the gate insulating film forming step, a channel protective layer is formed on each of the semiconductor layers.

7. The active matrix substrate of claim 1, wherein
each of the capacitor lines is a gate line.

8. The active matrix substrate of claim 1, wherein
a portion of the protective film which is included in each of the auxiliary capacitors is thinner than a portion of the protective film which covers each of the thin film transistors.

9. The active matrix substrate of claim 1, wherein
each of the auxiliary capacitors includes a conductive layer which is provided between the corresponding capacitor line and the protective film, and is provided in the same layer in which the source and drain electrodes of the corresponding thin film transistor are provided and is formed of the same material of which the source and drain electrodes of the corresponding thin film transistor are formed.

10. The active matrix substrate of claim 1, wherein
each of the thin film transistors includes an oxide semiconductor layer.

11. The active matrix substrate of claim 10, wherein
the oxide semiconductor layer is an In—Ga—Zn—O oxide semiconductor layer.

12. A liquid crystal display panel comprising:
an active matrix substrate and a counter substrate facing each other; and
a liquid crystal layer provided between the active matrix substrate and the counter substrate, with a plurality of pixels being arranged in a matrix, wherein the active matrix substrate includes a plurality of capacitor lines extending in one of directions in which the pixels are aligned and in parallel to each other;

a plurality of thin film transistors, one for each of the pixels;

a protective film covering the thin film transistors;

a plurality of pixel electrodes arranged in a matrix on the protective film and connected to the respective corresponding thin film transistors; and a plurality of auxiliary capacitors, one for each of the pixels, each of the auxiliary capacitors includes the corresponding capacitor line, the corresponding pixel electrode, and the protective film between the corresponding capacitor line and the corresponding pixel electrode, and in a portion in which each of the plurality of auxiliary capacitors is provided, a gate insulating film forming each of the plurality of thin film transistors is not provided.

* * * * *